United States Patent [19]

Riblet et al.

[11] 4,427,936

[45] Jan. 24, 1984

[54] REFLECTION COEFFICIENT MEASUREMENTS

[75] Inventors: Gordon P. Riblet, Wellesley; Bertil E. R. Hansson, Marlborough, both of Mass.

[73] Assignee: Microwave Development Labs, Needham, Mass.

[21] Appl. No.: 275,927

[22] Filed: Jun. 22, 1981

[51] Int. Cl.³ .............................................. G01R 27/04
[52] U.S. Cl. .................. 324/58 B; 333/125; 333/128
[58] Field of Search .................... 324/58 B, 58.5 B; 333/120, 123, 125, 127, 128, 136, 137, 1.1

[56] References Cited

U.S. PATENT DOCUMENTS

| 3,136,962 | 6/1964 | Bowness | 333/1.1 |
| 3,156,879 | 11/1964 | Hess | 333/136 |
| 3,701,054 | 10/1972 | Hagler et al. | 333/1.1 |
| 4,328,471 | 5/1982 | Quine | 333/128 |

FOREIGN PATENT DOCUMENTS 1202846 10/1965 Fed. Rep. of Germany ...... 333/128

OTHER PUBLICATIONS

Engen, *The Six-Port Reflectometer: An Alternative Network Analyzer*, IEEE Trans. on MTT, vol. MTT-25, Dec. 1977, pp. 1075-1080.

Granville-George et al., *Computer Controlled 6-Port Reflectometer...*, Conf: IEE Coll. on Microwave Measurement, London, Eng., 20 May 1981.

Crandell et al., *Reflectometers for Millimeter-Wave Measurements*, Microwave Journal, vol. 23, No. 6, Jun. 1980, pp. 59, 60, 63.

Montgomery et al., *Principles of Microwave Circuits*, McGraw-Hill, N.Y. 1948, pp. 455-459.

Primary Examiner—Paul L. Gensler
Attorney, Agent, or Firm—Wolf, Greenfield & Sacks

[57] ABSTRACT

A compact apparatus for the accurate measurement of complex reflection coefficients and VSWR of a device over a bandwidth of an octave or greater by preferably measuring three power levels at detectors associated with the device. The device is formed by the junction of 5 transmission lines two of which are used for receiving a test signal and for transmitting the signal to the device being measured. The other three transmission lines are connected to detector arms each having a detector associated therewith. The techniques of the invention are embodied herein in a waveguide embodiment, a stripline embodiment and a microstrip embodiment of the invention.

22 Claims, 8 Drawing Figures

OPTIMUM LOCATION OF THE POINTS $q_1$, $q_2$, AND $q_3$ IN THE COMPLEX PLANE FOR A 6-PORT

MEASURED PERFORMANCE OF EXPERIMENTAL
STRIPLINE FIVE-PORT JUNCTION

R = DISK RADIUS
Ψ = COUPLING ANGLE
ℓ = TRANSFORMER LENGTH
W = TRANSFORMER WIDTH

EXPERIMENTAL STRIPLINE
FIVE-PORT JUNCTION

REFLECTION COEFFICIENT MEASUREMENTS

BACKGROUND OF THE INVENTION

The present invention relates in general to a device for the accurate and rapid measurement of complex reflection coefficients by the measurement of power levels at four detectors. The device described herein is constructed in a compact arrangement in either stripline, microstrip or waveguide. The device of this invention provides for the accurate and rapid measurement of complex reflection coefficients and, more particularly, the accurate measurements of low voltage standing wave ratios over waveguide bandwidths, or with regard to a stripline, or microstrip construction, over octave bandwidths.

With regard to the measurement of VSWR probably the most common approach is to use a directional coupler. However, in order to provide an accurate measurement, in particular of low VSWR, there is the requirement of a precise mechanical construction of the directional coupler. Therefore, such devices have to be made within quite tight tolerances.

Accordingly, one object of the present invention is to provide a device that makes either complex reflection coefficient measurements or low VSWR measurements without the need of a coupler or the like that requires tight construction tolerances.

One of the oldest techniques for the measurement of complex reflection coefficients (both amplitude and phase) is the slotted line apparatus. In this apparatus, the measurement is accomplished by means of a mechanical procedure which is quite time consuming and not at all suitable for computerization of the measured data.

Accordingly, another object of the present invention is to provide a device which will allow for the rapid computerized evaluation of data. In accordance with the invention this is accomplished by means of direct measurement of three normalized power levels. These power levels are then operated upon in accordance with the theory of this invention to provide readings of complex reflection coefficient or VSWR.

In another technique, the reflection coefficient is obtainable from the power measured at three fixed probes spaced one-eighth wavelength apart along a slotted line. See, for example, the article by W. J. Duffin, "Three Probe Method of Impedance Measurement", Wireless Engineer, Vol. 29, pp. 317-320 (Dec. 1952). However, with this technique, the reflection coefficient is obtained with a high degree of accuracy only over a narrow frequency range for which the one-eighth wavelength condition is substantially satisfied.

Accordingly, a further object of this invention is to provide a device for measuring the complex reflection coefficient accurately by the simple measurement of power levels over a full waveguide bandwidth, or in the case of stripline or coax over an octave or greater bandwidth.

One prior article by Henry J. Riblet "A Swept-Frequency 3-Centimeter Impedance Indicator", Proceedings of the I.R.E., Vol. 36, pp. 1493-1499, Dec. 1948 describes a device for determining the complex reflection coefficient in waveguide from the powers coupled to two detectors. However, with this technique, the measurement accuracy is very sensitive to the actual phase of the reflected signal.

Thus, another object of the present invention is to provide a device for the measurement of reflection coefficients wherein the measurement accuracy is essentially independent of both amplitude and phase.

An article by Henry L. Bachman, "A Waveguide Impedance Meter for the Automatic Display of Complex Reflection Coefficients", IEEE Trans. on MTT, Vol. 3, pp. 27-30, Jan. 1955 describes a waveguide impedance meter for the automatic display of complex reflection coefficients. However, the circuit configuration requires many waveguide components. Furthermore, it assumes for its operation a frequency independent 90° phase shifter for which no practical realization exists. Also, the actual bandwidth is limited to 10%.

In another article by Glenn F. Engen, "An Improved Circuit for Implementing the Six-Port Technique of Microwave Measurements", IEEE Trans. on MTT, Vol. MTT-25, pp. 1080-1082, Dec. 1977 there is described a number of circuits for the accurate determination of the reflection coefficient over wide bandwidths from measurements of power levels at four detectors. Again, however, these circuits require many components.

BRIEF DESCRIPTION OF THE DRAWINGS

Numerous other objects, advantages and features of the invention should now become apparent upon a reading of the following detailed description taken in conjunction with the accompanying drawings in which.

EXPOSITION

Figure 1:
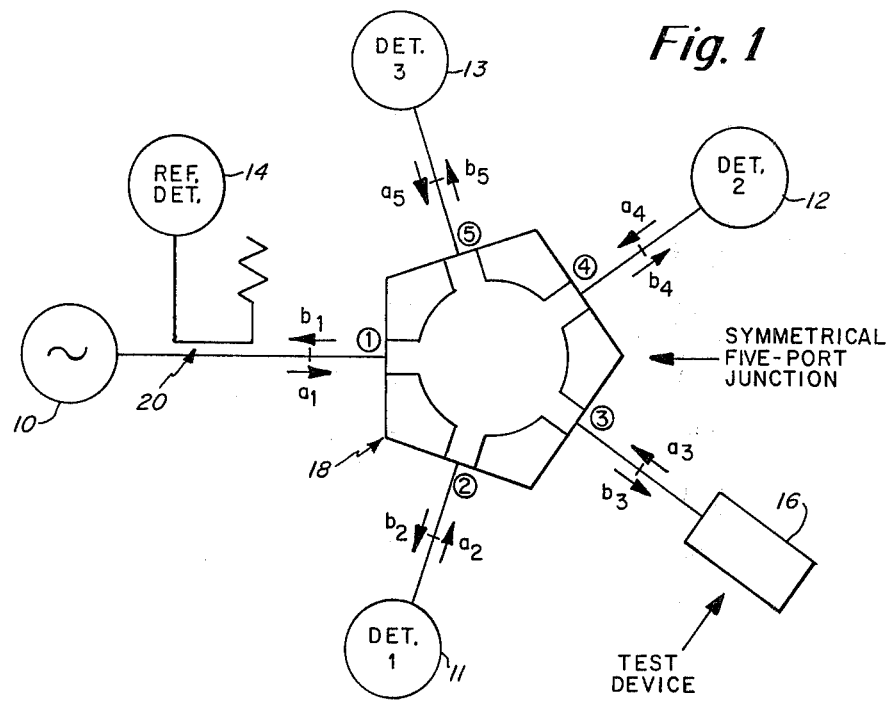
FIG. 1 schematically depicts the apparatus of the present invention for measuring reflection coefficient.

FIG. 1 schematically depicts the basic circuit configuration in accordance with the present invention including a signal source 10, detectors 11, 12 and 13, reference detector 14, and the test device 16. All of these components are associated with the basic device of this invention indicated at 18 and shown in more detail hereinafter in different embodiments including a stripline, microstrip and waveguide version. As indicated in FIG. 1, there is preferably provided a directional coupler 20 associated with the reference detector 14 to monitor the incident power coupled to the device 18. All of the detectors 11-14 may be of conventional design. As is apparent from FIG. 1, the device 18 is basically a five port device including the ports 1, 2, 3, 4 and 5. The signal source 10 is coupled to port 1, the detectors 11, 12 and 13 are coupled to the respective ports 2, 4 and 5 and the test device is coupled to the port 3. Note that the test device may also be coupled to port 2 with detector 11 coupled to port 3. Actually, the test device can be coupled to any port other than the signal input port.

An article by Glenn F. Engen, "The Six-Port Reflectometer: An Alternate Network Analyzer", IEEE Trans. on MTT, Vol. MTT-25, pp. 1075-1080, Dec. 1977 discloses a diagram in the complex $\Gamma$ plane. FIG.

Figure 2:
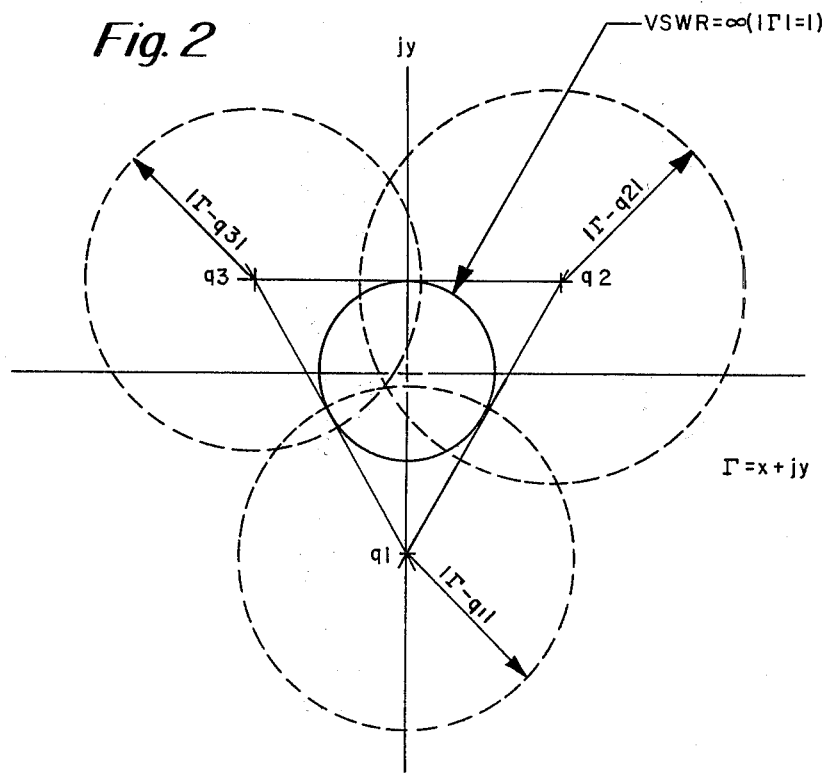
FIG. 2 shows a diagram in the complex gamma plane useful in determining the reflection coefficient.

2 herein shows a complex $\Gamma$ plane diagram. At a particular frequency the three detectors 11, 12 and 13 are represented by point $q_1$, $q_2$, and $q_3$ in the complex plane. The measured power ratios $P_1 = P_1/P_R$, $P_2 = P_2/P_R$, $P_3 = P_3/P_R$ corresponding to the three detectors, determine circles of known radius about points $q_1$, $q_2$ and $q_3$. $P_R$ is the power measured by the reference detector. $P_1$-$P_3$ are respective sensed powers at detectors 1, 2, and 3. It is the intersection of these circles which determines the complex reflection coefficient $\Gamma$. In FIG. 2 the points $q_1$, $q_2$, and $q_3$ are located at the vertices of an equilateral triangle which inscribes the unit circle. Engen has proposed that the optimum location for the points $q_1$, $q_2$, $q_3$ is in fact at the vertices of an equilateral triangle.

The usefulness of the arrangement depicted in FIG. 1 for making accurate reflection coefficient measurements is based on the fact that for a matched symmetrical reciprocal five port device the points $q_1$, $q_2$, and $q_3$ lie at the vertices of the equilateral triangle depicted in FIG. 2. Consequently, this circuit arrangement is an optimum one for making six-port measurements providing only that the five port device 18 in FIG. 1 is matched. The symmetrical reciprocal matched five port junction has a certain analogy to the symmetrical nonreciprocal three port circular junction in that here the desired function (namely circulation) is again achieved provided only that the device is matched.

The chapter by Robert H. Dicke in the book by C. G. Montgomery, R. H. Dicke, and E. M. Purcell, *Principles of Microwave Circuits*, New York: McGraw-Hill, 1948 gives the S matrix element-eigenvalue relations for the symmetrical reciprocal 5 port junction. Dicke has used these relations to show that a lossless symmetrical reciprocal 5 port junction functions as a perfect 4-way power divider if it is matched. With the use of these 3 matrix relations it can also readily be shown that such a junction has the property stated above provided only that it is matched. In particular the Smith chart parameters $|\Gamma| \cos \theta$, $|\Gamma| \sin \theta$ will be linearly related to the normalized powers $P_1$, $P_2$, $P_3$ by $$|\Gamma| \cos \theta = \tfrac{2}{3}\overline{P_1} - \tfrac{1}{3}\overline{P_2} - \tfrac{1}{3}\overline{P_3} \qquad (1)$$

$$|\Gamma| \sin \theta = -\frac{1}{\sqrt{3}}\overline{P_2} + \frac{1}{\sqrt{3}}\overline{P_3} \qquad (2)$$

when the junction is matched and when the directional coupler is ideal.

Figure 3:
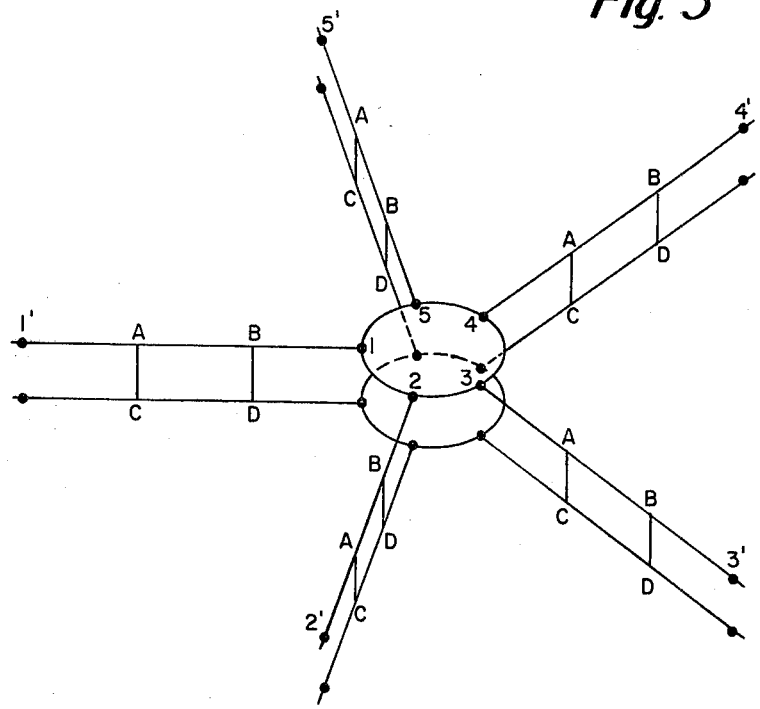
FIG. 3 illustrates the ABCD matrices for matching the symmetrical five port junction of FIG. 1.

The problem of making an ideal six-port device for measuring complex reflection coefficients $\Gamma$ then reduces to the problem of how to match a symmetrical five port junction by connecting identical matching networks at each port as represented by the ABCD matrices in FIG. 3. For this purpose an equivalent admittance $Y_{eq}$ can be defined for this sort of junction which is similar to the equivalent admittance which has been derived for the three port circulator in the article by Gordon P. Riblet, "The measurement of the equivalent admittance of 3 port circulators via an automated measurement system", IEEE Trans. on MTT, Vol. MTT-25, pp. 401-405, May 1977. This complex quantity $Y_{eq}$ has the property that if a two port matching network can be found which matches into $Y_{eq}$, then the same matching network connected at each port of the five port will match the five port.

The expressions for $Y_{eq} = G_{eq} + j B_{eq}$ for the three port circulator in terms of the eigenadmittances $Y_0$, $Y_1$, and $Y_{-1}$ given in the above article follows from the requirement that the phases of the three eigenreflection coefficients $S_0$, $S_1$, $S_{-1}$ differ by 120° on the unit circle if the circulator is to be matched. These are:

$$G_{eq} = \frac{(1 + Y_0^2)G^*(3)}{G^*(3)^2 + (Y^*(3) + Y_0)^2} \qquad (3)$$

$$B_{eq} = \frac{G^*(3)^2 Y_0 - (1 - Y^*(3)Y_0)(Y^*(3) + Y_0)}{G^{*2}(3) + (Y^*(3) + Y_0)^2} \qquad (4)$$

where, $$G^*(3) = \frac{\sqrt{3}}{2}\left( \frac{Y_1 + 1/Y_0}{1 - Y_1/Y_0} - \frac{Y_{-1} + 1/Y_0}{1 - Y_{-1}/Y_0} \right) \qquad (5)$$

$$B^*(3) = \tfrac{1}{2}\left( \frac{Y_1 + 1/Y_0}{1 - Y_1/Y_0} + \frac{Y_{-1} + 1/Y_0}{1 - Y_{-1}/Y_0} \right) \qquad (6)$$

In the case of the symmetrical reciprocal five port junction the requirement for a perfect match is that the phase of $S_1$ differ from that of $S_o$ by 104.5° and that the phase of $S_2$ differ from that of $S_o$ by $-104.5°$ or visa versa. This leads to only small changes in the above formulas. In particular $Y_{-1}$ must be replaced by $Y_2$ and the constant $\sqrt{3}/2$ multiplying the expression in brackets in equation (3) must be replaced by $\tfrac{1}{2}\sqrt{5/3}$. Consequently, to obtain $G_{eq}$ and $B_{eq}$ for the five port from equations (3) and (4), we must replace equations $G^*(3)$, $B^*(3)$ by $G^*(5)$ and $B^*(5)$ where;

$$G^*(5) = \tfrac{1}{2}\frac{\sqrt{5}}{\sqrt{3}}\left( \frac{Y_1 + 1/Y_0}{1 - Y_1/Y_0} - \frac{Y_2 + 1/Y_0}{1 - Y_2/Y_0} \right) \qquad (7)$$

$$B^*(5) = \tfrac{1}{2}\left( \frac{Y_1 + 1/Y_0}{1 - Y_1/Y_0} + \frac{Y_2 + 1/Y_0}{1 - Y_2/Y_0} \right) \qquad (8)$$

Figure 4:
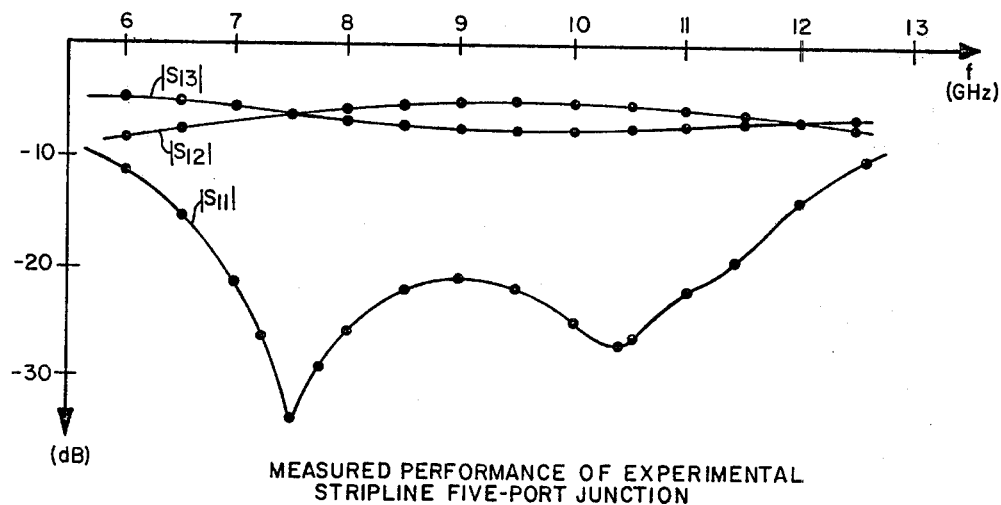
FIG. 4 is a graph of measured return loss versus frequency for a symmetrical stripline five-port junction such as schematically illustrated in FIG. 1.
Figure 5A:
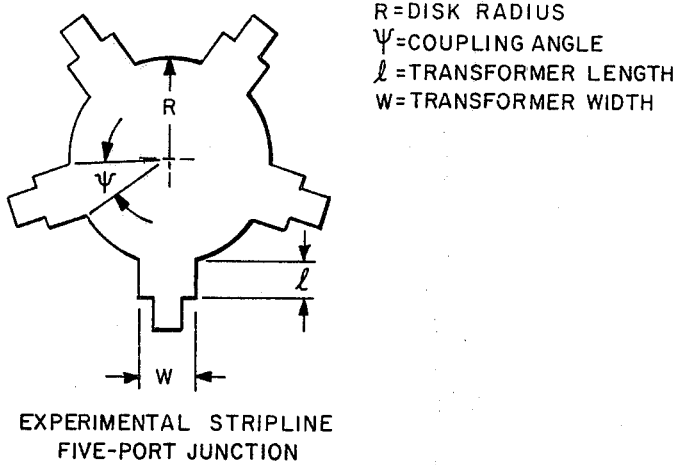
FIGS. 5A and 5B show a stripline construction for the schematic apparatus of FIG. 1.
Figure 5B:
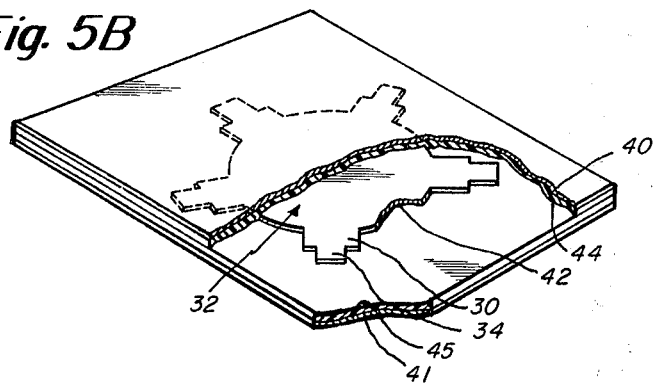

The equations (3), (4) and (7), (8) allow the equivalent admittance to be determined for those geometries for which the eigenadmittances $Y_0$, $Y_1$, and $Y_2$ can be calculated. A good example is the planar stripline geometry given in FIGS. 5A and 5B. The circular disk is assumed to have a known radius R. The coupling angle $\Psi$ between the disk and the transmission lines is also assumed known. For this case the eigenadmittances $Y_o$, $Y_1$, and $Y_2$ can be calculated according to series expansions published in an article by J. B. Davies and P. Cohen, "Theoretical design of symmetrical junction stripline circulators", IEEE Trans. Microwave Theory & Tech., Vol. MTT-11, pp. 506-512, Nov. 1963. FIGS. 5A and 5B show a 5 port stripline junction designed according to this procedure. It has been found that if the coupling angle $\Psi$ between the stripline and this disk is about 40° then for a frequency range greater than an octave the conductance $G_e$ is nearly constant while the susceptance $B_e$ is small. This allows for a well matched condition over a broad bandwidth while using only a very simple matching network such as a short section of transmission line of either high or low impedance at the junction to compensate for $B_e$. With regard to the specific embodiment of FIGS. 5A and 5B wherein the susceptance $B_e$ is inductive, a matching network may be used in the form of a short section 30 of low impedance transmission line of length 1 and width w connecting the disk 32 to the 50 Ω line 34. FIG. 4 gives the measured return loss from 5.5–12.5 GHZ. The return loss is better than 10 dB over this band and better than 20 dB over most of it. Although ideal performance is not obtained if the return loss is 10 dB, useful measurements can still be made by calibrating the device with known standards to correct for system errors prior to beginning measurements. In particular equations (1) and (2) are replaced by $$|\Gamma| \cos \theta = \frac{D_1 + D_2 \bar{P}_1 + D_3 \bar{P}_2 + D_4 \bar{P}_3}{1 + D_9 \bar{P}_1 + D_{10} \bar{P}_2 + D_{11} \bar{P}_3} \quad (9)$$

$$|\Gamma| \sin \theta = \frac{D_5 + D_6 \bar{P}_1 + D_7 \bar{P}_2 + D_8 \bar{P}_3}{1 + D_9 \bar{P}_1 + D_{10} \bar{P}_2 + D_{11} \bar{P}_3} \quad (10)$$

where the eleven calibration constants $D_1$ and $D_{11}$ are determined at each measurement frequency during the calibration procedure. This is the usual procedure when making measurements with a six-port device.

The following two references may be referred to in deriving equations (9) and (10):

H. M. Cronson, and L. Susman, "A Six-Port Automatic Network Analyser", IEEE Trans. on MTT, Vol. MTT-25, pp. 1086–1091, Dec. 1977.

G. F. Engen, "Calibrating the Six-Port REflectometer by Means of Sliding Terminations", IEEE Trans. on MTT, Vol. MTT-26, pp. 951–957, Dec. 1978.

Although it is preferred to use matching such as shown in FIGS. 5A and 5B, it should be understood that a device can be constructed in accordance with the present invention useful over a narrow bandwidth without the use of such matching.

In FIGS. 5A and 5B the following parameters apply:
R = disk radius
Ψ = coupling angle
l = transformer length
w = transformer width FIG. 5B is a cross-section through the stripline junction of FIG. 5A showing the different layers including outer conductors 40, 41, the disk conductor 42 and dielectric layers 44, 45.

Figure 6A:
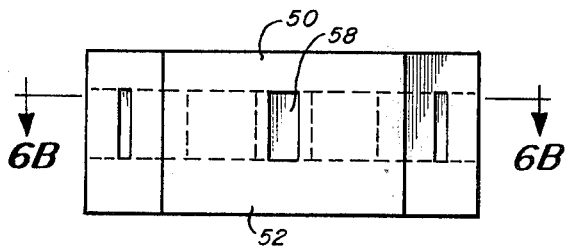
FIGS. 6A and 6B show a waveguide construction associated with the schematic apparatus of FIG. 1.
Figure 6B:
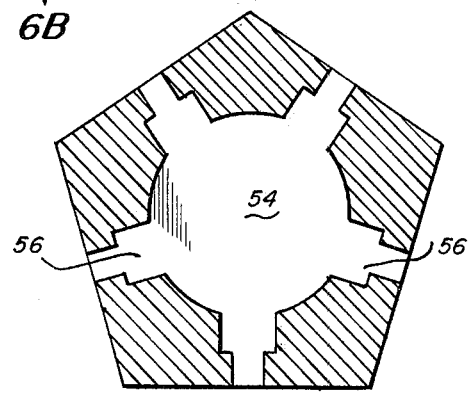

FIGS. 5A and 5B describe an embodiment that may be constructed in stripline or microstrip. The concepts of the invention may also be applied to the construction of a waveguide power divider in which case the main disk or resonator is in the form of a waveguide cavity such as depicted in FIGS. 6A and 6B. The transformers are formed by waveguide steps coupling to a waveguide transmission line with each transmission step coupling into the central resonator structure. FIGS. 6A and 6B show a typical waveguide construction formed of top and bottom pieces 50 and 52. These members are of pentagonal shape. These pieces define a waveguide cavity 54 having directed off of it five separate waveguide transformer steps 56. FIG. 6A shows the rectangular waveguide port 58 leading to each of the waveguide steps.

What is claimed is:

1. A matched lossless reciprocal power divider used for the measurement of reflection coefficient and comprising;
   means defining a common central resonator junction having only five ports,
   a transmission line associated with each port,
   only five matching means associated respectively with the five transmission lines intercoupling each transmission line to a port of the resonator junction,
   first, second and third power level detectors,
   a first of said ports receiving a test signal,
   a second of said ports coupling to a device being measured,
   third, fourth and fifth of said ports coupling, respectively, to said first, second and third power level detectors,
   and a directional coupler associated with the transmission line coupling to the first port and including means coupled from the coupler for monitoring the incident power coupled to the resonator junction.

2. A matched reciprocal power divider as set forth in claim 1 wherein each matching network comprises a matching transformer.

3. A matched reciprocal power divider as set forth in claim 1 having five fold rotational symmetry.

4. A matched reciprocal power divider as set forth in claim 1 made in stripline construction.

5. A matched reciprocal power divider as set forth in claim 1 made in waveguide construction.

6. A matched reciprocal power divider as set forth in claim 1 made in microstrip construction.

7. A matched reciprocal power divider as set forth in claim 1 wherein said means coupled from the coupler for monitoring the incident power comprises a reference detector.

8. A matched reciprocal power divider as set forth in claim 1 wherein all ports are disposed radially of the central resonator junction and are substantially planar.

9. A matched reciprocal power divider as set forth in claim 1 wherein the central resonator junction has the transmission lines coupled therewith in a spaced relationship from one to the next transmission line.

10. A matched reciprocal power divider as set forth in claim 9 wherein said central resonator junction has separate peripheral wall segments interconneting the ports one to the next adjacent.

11. A matched reciprocal power divider as set forth in claim 1 wherein reflection coefficient is established in accordance with the following equations:

$$|\Gamma| \cos \theta = \tfrac{2}{3} \bar{P}_1 - \tfrac{1}{3} \bar{P}_2 - \tfrac{1}{3} \bar{P}_3 \quad (1)$$

$$|\Gamma| \sin \theta = -\frac{1}{\sqrt{3}} \bar{P}_2 + \frac{1}{\sqrt{3}} \bar{P}_3 \quad (2)$$

wherein $P_1$, $P_2$ and $P_3$ are normalized powers corresponding respectively to said first, second and third power level detectors and $\theta$ is the angle associated with the quantity $|\Gamma|$.

12. A matched lossless reciprocal power divider used for the measurement of reflection coefficient and comprising;
   five transmission lines defining five ports of the divider, one of said ports forming an input port and at least another of said ports forming an output port,
   a central resonator region,
   means intercoupling the transmission lines to the central resonator region to enable power division between the input and output ports, said central resonator having the transmission lines coupled therewith in a spaced relation from one to the next transmission line, first, second and third power level detectors, means coupling the the first, second and third power level detectors to the remaining three ports, respectively, and a directional coupler associated with the transmission line coupling to the one port and including means coupled from the coupler for monitoring the incident power coupled to the resonator region.

13. A matched reciprocal power divider as set forth in claim 12 wherein the divider is characterized by five fold rotational symmetry.

14. A matched reciprocal power divider as set forth in claim 13 wherein said means coupled from the coupler for monitoring the incident power comprises a reference detector.

15. A matched reciprocal power divider as set forth in claim 12 wherein each matching network comprises a matching transformer.

16. A matched reciprocal power divider as set forth in claim 12 made in stripline construction.

17. A matched reciprocal power divider as set forth in claim 12 made in waveguide construction.

18. A matched reciprocal power divider as set forth in claim 12 made in microstrip construction.

19. A matched reciprocal power divider as set forth in claim 12 wherein the divider has only five ports.

20. A matched reciprocal power divider as set forth in claim 12 wherein all ports are disposed radially of the central resonator junction and are disposed in a substantially planar interrelationship.

21. A matched reciprocal power divider as set forth in claim 12 wherein the central resonator junction has separate peripheral wall segments interconnecting the ports one to the next adjacent port.

22. A matched reciprocal power divider as set forth in claim 12 wherein reflection coefficient is established in accordance with the following equations:

$$|\Gamma| \cos \theta = \tfrac{2}{3}\bar{P}_1 - \tfrac{1}{3}\bar{P}_2 - \tfrac{1}{3}\bar{P}_3 \quad (1)$$

$$|\Gamma| \sin \theta = -\frac{1}{\sqrt{3}}\bar{P}_2 + \frac{1}{\sqrt{3}}\bar{P}_3 \quad (2)$$

wherein $P_1$, $P_2$ and $P_3$ are normalized powers corresponding respectively to said first, second and third power level detectors and $\theta$ is the angle associated with the quantity $|\Gamma|$.

* * * * *